US006625431B1

(12) United States Patent
Fujii

(10) Patent No.: US 6,625,431 B1
(45) Date of Patent: Sep. 23, 2003

(54) TUNER DEVICE

(75) Inventor: Noriyuki Fujii, Osaka (JP)

(73) Assignee: Funai Electronics, Co.. Ltd., Daito (JP)

( * ) Notice: Subject to any disclaimer, the term of this patent is extended or adjusted under 35 U.S.C. 154(b) by 0 days.

(21) Appl. No.: 09/465,942

(22) Filed: Dec. 17, 1999

(51) Int. Cl.[7] .............................. H04N 5/50; H04N 9/45; H04L 27/06
(52) U.S. Cl. ..................... 455/191.1; 450/260; 450/264; 450/265; 450/192.2; 450/192.3; 375/344
(58) Field of Search .......................... 455/192.2, 192.1, 455/182.1, 260, 257, 184.1, 196.1, 196.2, 196.3, 265; 375/344, 376, 97

(56) References Cited

U.S. PATENT DOCUMENTS

| 3,859,599 | A | * | 1/1975 | Peil .............................. 455/265 |
| 4,498,191 | A | * | 2/1985 | Rogers ..................... 455/164.2 |
| 4,542,533 | A | * | 9/1985 | Parker ..................... 455/182.2 |
| 4,945,415 | A | * | 7/1990 | McGinn .................. 455/192.2 |
| 5,450,447 | A | * | 9/1995 | Dutta .......................... 375/344 |
| 5,517,678 | A | * | 5/1996 | Klank et al. .............. 455/182.2 |
| 5,612,977 | A | * | 3/1997 | Ogoro .......................... 375/344 |
| 5,630,215 | A | * | 5/1997 | Waldie et al. ........... 455/192.2 |
| 5,706,315 | A | * | 1/1998 | Ogoro ........................ 375/344 |
| 6,094,236 | A | * | 7/2000 | Abe et al. ................ 455/191.1 |
| 6,356,599 | B1 | * | 3/2002 | Lee .......................... 455/182.2 |

FOREIGN PATENT DOCUMENTS

| JP | 58-173982 | 10/1983 |
| JP | 59-55619 | 3/1984 |
| JP | 61-46612 | 3/1986 |
| JP | 2-86206 | 3/1990 |

* cited by examiner

Primary Examiner—Dwayne Bost
Assistant Examiner—Kamran Afshar
(74) Attorney, Agent, or Firm—Crowell & Moring LLP

(57) ABSTRACT

A phase-locked loop (PLL) tuning controller monitors a voltage value of an automatic frequency control (AFC) signal, and detects a first frequency at which a first threshold voltage value accords with the AFC voltage value while varying an oscillation frequency of a local oscillator in either direction of frequency-increasing or frequency-decreasing in accordance with an AFC value when a synchronous signal of a broadcasting to be received is first detected. After then, a second frequency at which a second threshold voltage value having a value different from the first threshold value accords with the AFC voltage value while varying the oscillation frequency in a reversed direction for which the first frequency has been detected. Then the second frequency is locked as a center frequency of the broadcasting to be received. Accordingly, even if the AFC voltage level irregularly varies, the tuning frequency is fixed to the original center frequency of the broadcast to be received.

10 Claims, 2 Drawing Sheets

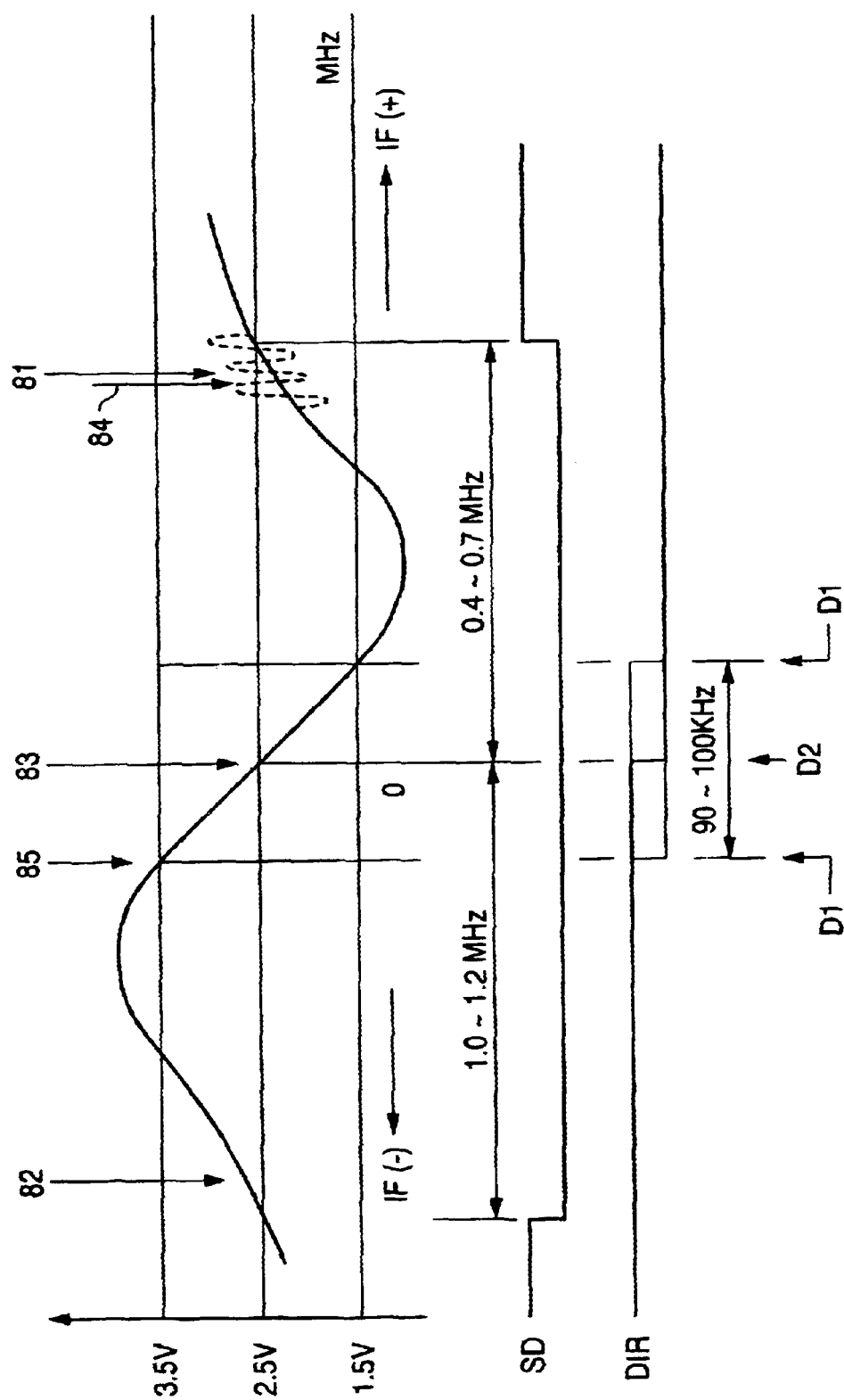

TUNER DEVICE

BACKGROUND OF THE INVENTION

The present invention relates to a tuner device such as a television receiver, a cable television or the like, for example, having a PLL (phase-locked-loop) tuning controller for controlling the oscillation frequency of a local oscillator.

The tuner device for a television receiver, for example, having a PLL tuning controller performs the phase lock operation at the time of the tuning operation using the PLL in a manner that the detecting operation of a synchronous signal is performed and the detecting operation of an inflection point of an AFC (automatic frequency control) voltage is performed thereby to lock the center frequency to a receiving frequency (see Japanese Patent Publication No. 2-46206A, for example).

In such a tuner device, the PLL tuning controller performs the phase lock operation in a manner that the detecting operation of the synchronous signal (hereinafter referred to an SD signal) is performed, then the detecting operation of the level inflection point of an AFC voltage (hereinafter referred to an AFC operation) is performed twice to the frequency increasing direction and the frequency decreasing direction, thereby to lock the center frequency to the receiving frequency.

The explanation will be made as to the related SD signal detection operation and AFC operation.

In the related SD signal detection operation, the PLL tuning controller outputs the frequency, that is, PLL data corresponding to the frequency of a broadcasting to be received thereby to detect the SD signal. That is, the SD signal detection is performed in a manner that the PLL tuning controller firstly outputs the signal with a frequency deviated by −1.3 MHz from the center frequency of the broadcasting to be received, then outputs the signal with a frequency deviated by −2.6 MHz from the center frequency, then outputs the signal with a frequency deviated by +1.31 MHz from the center frequency, and finally outputs the signal with the center frequency again.

If the SD signal is detected in any point, the process proceeds to the AFC operation at this time point.

FIG. 2 is a diagram showing the relationship between the SD signal as to the AFC voltage and a signal DIR for detecting the level inflection point of the AFC voltage. The SD signal has a frequency width of 1.0 to 1.2 MHz to the negative direction (frequency reducing direction) as to the center frequency (e.g., 45.75 MHz) of the intermediate frequency (IF) and has a frequency width of 0.4 to 0.7 MHz to the positive direction (frequency increasing direction) as to the center frequency, and hence has a frequency width of 1.4 to 1.9 MHz in total. The AFC voltage is converted into a digital value through the analog-to-digital (A/D) conversion in order to obtain the DIR signal. That is, for example, the AFC voltage less than 2.5 volt is converted into a low level "L" and the AFC voltage of 2.5 volt or more is converted into a high level "H".

In the AFC operation, a level shift point of the DIR signal is searched by changing the intermediate frequency (IF) step by step in three steps totally (one step is 27.965 kHz) to each of the frequency increasing and decreasing directions. In this case, when the AFC voltage is lower than 2.5 volt (for example, a point shown by a reference numeral 81 in FIG. 2), the PLL data is changed so as to decrease the intermediate frequency (IF) until the AFC voltage exceeds 2.5 volt. In contrast, when the AFC voltage is higher than 2.5 volt (for example, a point shown by a reference numeral 82 in FIG. 2), the PLL data is changed so as to increase the intermediate frequency (IF) until the AFC voltage decreases less than 2.5 volt. In this manner, the first operation is performed. In the first operation, the threshold value is set to 2.5 volt.

Then, when the level shift point of the DIR signal is detected in the first operation, the PLL data is changed so as to change the intermediate frequency step by step to the reversed direction of the first operation until the AFC voltage exceeds 2.5 volt or decreases lower than 2.5 volt thereby to detect again the level shift point of the DIR signal. In this manner, the second operation is performed. In the second operation, the threshold value is set to 2.5 volt as same as the first operation.

When the level shift point of the DIR signal is again detected in the second operation, the intermediate frequency is fixed, and the SD signal detection is performed again. In this manner, a series of the tuning operation is completed. When the aforesaid operations are performed normally, the intermediate frequency can be fixed to the final tuning point 83 shown in FIG. 2.

As described above, in the aforesaid related AFC operation, the threshold value for detecting the level shift point of the DIR signal is set to 2.5 volt as to each of the first and second operations.

However, the level of the AFC voltage sometimes changes unexpectedly irrespective of the frequency controlled by the PLL tuning controller. For example, when the actual frequency transmitted from a broadcasting is deviated from the center frequency of the broadcasting to be received based on the PLL data outputted from the PLL tuning controller (for example, when the former deviates from the latter by −0.5 MHz), the level of the AFC voltage changes unexpectedly. The reason of such a phenomenon is considered that the ripple generated within the PLL is superimposed on the output frequency thereof.

In this case, the intermediate frequency at the time where the SD signal is detected corresponds to the point 81 shown in FIG. 2. In this state, supposing that the level of the AFC voltage varies as shown by a dashed line shown in FIG. 2, there arises a problem that if the first operation is started in this state, the level of the AFC voltage exceeds 2.5 volt at a point 84 shown in FIG. 2 before the intermediate frequency reaches to the original final tuning point (frequency) and so the intermediate frequency is fixed to the deviated point 84. In other words, there arise a problem that the receiving frequency can not be fixed accurately to the center frequency of a broadcasting to be received.

SUMMARY OF THE INVENTION

The present invention has been made in view of the aforesaid problem, it is therefore an object of the present invention is to provide a tuner device which can accurately fix a receiving frequency to the center frequency of a broadcasting thereby to terminate the tuning operation even if the level of an AFC voltage changes unexpectedly.

In order to attain the aforesaid object, there is provided a tuner device comprising:

a local oscillator; and a phase-locked loop (PLL) tuning controller for:

monitoring a voltage value of an automatic frequency control (AFC) signal;

detecting a first frequency at which a first threshold voltage value accords with the AFC voltage value while varying an oscillation frequency of the local oscillator in either direction of frequency-increasing or frequency-decreasing in accordance with an AFC value when a synchronous signal of a broadcasting to be received is first detected;

detecting a second frequency at which a second threshold voltage value having a value different from the first threshold value accords with the AFC voltage value while varying the oscillation frequency in a reversed direction for which the first frequency has been detected; and locking the second frequency as a center frequency of the broadcasting to be received.

The first threshold voltage value is set as two voltage values defining a predetermined voltage width, and the second threshold voltage value is set as a predetermined single voltage value.

The predetermined voltage width is set so as to cover an irregular variation width of the AFC voltage value.

When the lower value of the first threshold voltage value is set as A1, the higher value of the first threshold voltage value is set as A2, and the second threshold voltage value is set as B, the PLL tuning controller lowers the oscillation frequency until the AFC voltage value exceeds the value A2 if the AFC voltage values is less than the value B when the synchronous signal is first detected, and raises the oscillation frequency until the AFC voltage value becomes less than the value A1 if the AFC voltage value exceeds the value B when the synchronous signal is first detected.

The value A1 is set in a range of (B−0.5) to (B−1.0) [V], and the value A2 is set in a range of (B+0.5) to (B+1.0) [V].

According to the present invention, there is also provided a phase-locked loop (PLL) tuning control method comprising the steps of:

monitoring a voltage value of an automatic frequency control (AFC) signal;

detecting a first frequency at which a first threshold voltage value accords with the AFC voltage value while varying an oscillation frequency of a local oscillator in either direction of frequency-increasing or frequency-decreasing in accordance with an AFC value when a synchronous signal of a broadcasting to be received is first detected;

detecting a second frequency at which a second threshold voltage value having a value different from the first threshold value accords with the AFC voltage value while varying the oscillation frequency in a reversed direction for which the first frequency has been detected; and locking the second frequency as a center frequency of the broadcasting to be received.

BRIEF DESCRIPTION OF THE DRAWINGS

In the accompanying drawings:

FIG. 2 is a diagram showing the relationship between a synchronous signal SD and an inflection point detecting signal DIR as to an AFC voltage.

DETAILED DESCRIPTION OF THE PREFERRED EMBODIMENTS

Figure 1:
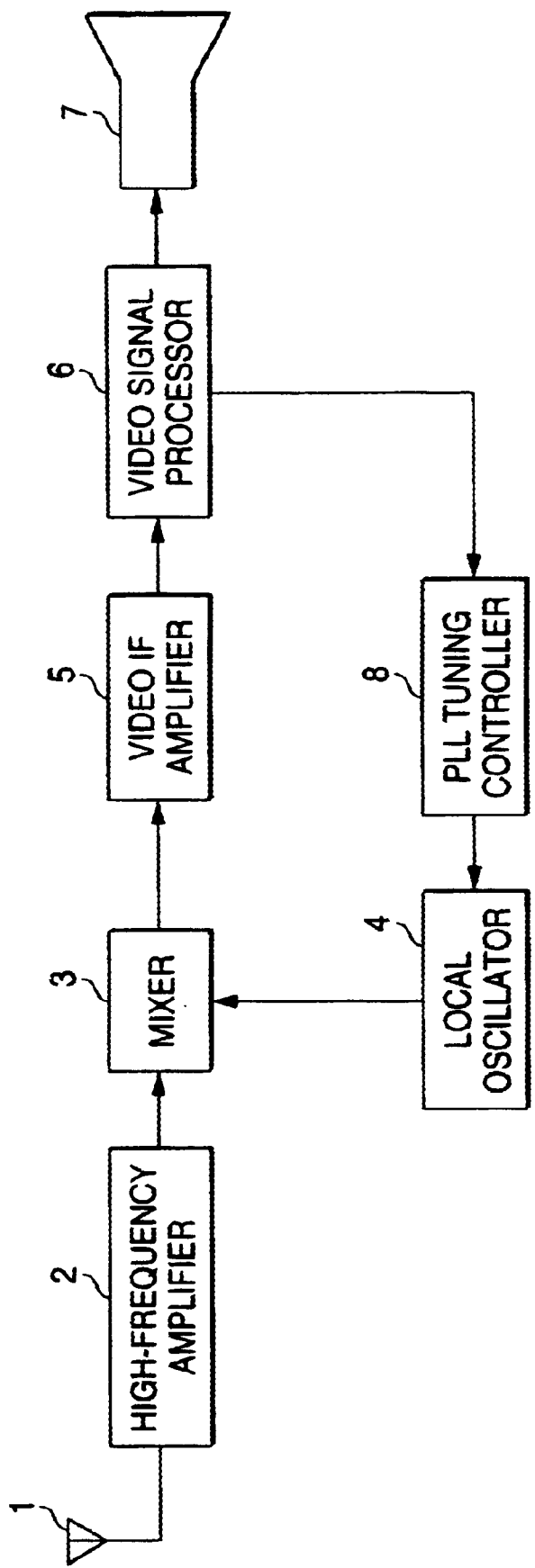
FIG. 1 is a block diagram showing the electric configuration of a television receiver including a tuner device according to an embodiment of the present invention.

A tuner device according to an embodiment of the present invention will be explained with reference to the accompanying drawings.

FIG. 1 is a block diagram showing the electric configuration of a television receiver including, a tuner device according to the embodiment of the present invention.

In FIG. 1, an output of a high-frequency amplifier 2 connected to a receiving antenna 1 is applied to a mixer 3 to which an output of a local oscillator 4 is connected. An output of the mixer 3 is applied to a video IF amplifier 5, then an output of the video IF amplifier 5 is applied to a video signal processor 6 and an output of the video signal processor 6 is applied to a television receiver 7 as primary color signals R, G, B.

The local oscillator 4 is applied with a control output of a PLL tuning controller 8 for controlling the oscillation frequency of the local oscillator 4. The PLL tuning controller 8 is applied with a horizontal synchronous signal separated from a synchronous signal separator (not shown) contained in the video signal processor 6.

Then, the explanation will be made as to the PLL locking operation of the PLL tuning controller 8 thus configured, that is, the SD signal detection operation and the AFC operation.

The SD signal detection operation in this embodiment is same as that of the aforesaid related art. That is, the SD signal detection operation of the PLL tuning controller 8 is performed in such an order that, the signal with a frequency deviated by −1.3 MHz from the center frequency of the broadcasting to be received is outputted, then the signal with a frequency deviated by −2.6 MHz from the center frequency is outputted, then the signal with a frequency deviated by +1.31 MHz from the center frequency is outputted, and finally the signal with the center frequency is outputted again.

If the SD signal is detected in any point, the process proceeds to the AFC operation at this time point.

In this embodiment, the AFC operation is performed by executing the first and second operations like the aforesaid related art, but in this case the threshold values of the first and second operations are made different to each other. That is, supposing that the threshold values used in the first operation are respectively A1 volt and A2 volt and the threshold value used in the second operation is B volt, the value A1 is set in a range of −0.5 volt to −1.0 volt with respect to the value B, the value A2 is set in a range of +0.5 volt to +1.0 volt with respect to the value B. In this embodiment, the values of the A1, A2 and B are set to 1.5 volt, 3.5 volt and 2.5 volt, respectively. In this respect, the values of the A1 and A2 with respect to the value B may be determined so as to substantially cover the unexpected level change of the AFC voltage, that is, may be values substantially not influenced by the unexpected level change of the AFC voltage. As a result of the experimentation, the level change of the AFC voltage ranges from 2.3 volt to 2.7 volt.

In this embodiment, since the threshold value of the first operation is set to have a predetermined width, it takes slightly longer time as compared with the related art to detect the shift point D1 of the DIR signal for the first operation. In other words, the changing width of the intermediate frequency IF to the negative direction (frequency reducing direction) or the positive direction (frequency increasing direction) becomes larger as compared with the related art. In order to obviate such an inconvenience, the intermediate frequency is changed in six steps to each of the frequency increasing and decreasing directions in this embodiment, while the intermediate frequency is changed in three steps to each of the frequency increasing and decreasing directions in the related art. That is, in the embodiment, the aforesaid inconvenience is obviated by setting the changing width of the intermediate frequency to the frequency increasing and decreasing directions is set to be twice the related art. Incidentally, in the embodiment, the number of steps to each of the frequency increasing and decreasing directions is not limited to six, and the number of steps may be set to five or seven.

To be more concrete, in the first operation of the AFC operation in this embodiment, the intermediate frequency is changed in six steps (one step is 27.965 kHz) to each of the frequency increasing and decreasing directions thereby to detect the first level shift point D1 of the DIR signal. In this case, when the AFC voltage is lower than 2.5 volt (for example, the point 81 in FIG. 2), the PLL data is changed so as to decrease the intermediate frequency (IF) until the AFC voltage exceeds 3.5 volt. In contrast, when the AFC voltage is higher than 2.5 volt (for example, the point 82 in FIG. 2), the PLL data is changed so as to increase the intermediate frequency (IF) until the AFC voltage decreases less than 1.5 volt.

Accordingly, even in the case where the level of the AFC voltage varies as shown by the dashed line shown in FIG. 2, since this level variation of the AFC voltage does not exceed 3.5 volt, the intermediate frequency (IF) does not stop at the point where the AFC voltage is 2.5 volt but continues to change to the frequency decreasing direction even if this level variation of the AFC voltage contains a point at which the AFC voltage is 2.5 volt. Then, when the intermediate frequency (IF) passes the final tuning point (frequency) and continues to change to a point where the AFC voltage exceeds 3.5 volt (a point shown by a reference numeral 85 in FIG. 2), this point is detected as the first level shift point D1 of the DIR signal.

When the first level shift point D1 of the DIR signal is detected in this manner, then the second operation is executed. This second operation is same as that of the aforesaid related art. To be more concrete, the PLL data is changed so as to change the intermediate frequency step by step (one step is 27.965 kHz) to the reversed direction of the first operation (in this case, the positive direction (frequency increasing direction)) until the AFC voltage reduces less than 2.5 volt thereby to detect a second level shift point D2 of the DIR signal, which corresponds to the final tuning point.

When the second level shift point D2 of the DIR signal is detected, the intermediate frequency is fixed thereto, and the SD signal detection is performed again. In this manner, a series of the tuning operation is completed.

According to the aforesaid AFC operation, even when the level of the AFC voltage varies due to the fact that the actual frequency transmitted from a broadcasting is deviated from the center frequency of the broadcasting to be received, a receiving frequency can be accurately fixed to the center frequency of the broadcasting.

Accordingly, according to the tuner device of the present invention, the threshold values of the AFC voltage are made different between the first and second detecting operations of the level shift points in a manner that, in the first detecting operation, the two kinds of threshold values having a constant width therebetween is set so as to cover the level change range of the AFC voltage, that is, out of the level change range of the AFC voltage, while in the second detecting operation, one kind of threshold value is set. According to such a configuration, the receiving frequency can be accurately fixed to the original center frequency of a broadcasting even when the level of an AFC voltage changes unexpectedly.

What is claimed is:

1. A tuner device comprising:
   a local oscillator; and
   a phase-locked loop (PLL) tuning controller for:
   monitoring a voltage value of an automatic frequency control (AFC) signal;
   detecting a first frequency at which a first threshold voltage value accords with the AFC voltage value while varying an oscillation frequency of the local oscillator in either direction of frequency-increasing or frequency-decreasing in accordance with an AFC value when a synchronous signal of a broadcasting to be received is first detected;
   detecting a second frequency at which a second threshold voltage value having a value different from the first threshold value accords with the AFC voltage value while varying the oscillation frequency in a reversed direction for which the first frequency has been detected; and
   locking the second frequency as a center frequency of the broadcasting to be received.

2. The tuner device as set forth in claim 1, wherein the first threshold voltage value is set as two voltage values defining a predetermined voltage width, and the second threshold voltage value is set as a predetermined single voltage value.

3. The tuner device as set forth in claim 2, wherein the predetermined voltage width is set so as to cover an irregular variation width of the AFC voltage value.

4. The tuner device as set forth in claim 2, wherein when the lower value of the first threshold voltage value is set as A1, the higher value of the first threshold voltage value is set as A2, and the second threshold voltage value is set as B, the PLL tuning controller lowers the oscillation frequency until the AFC voltage value exceeds the value A2 if the AFC voltage values is less than the value B when the synchronous signal is first detected, and raises the oscillation frequency until the AFC voltage value becomes less than the value A1 if the AFC voltage value exceeds the value B when the synchronous signal is first detected.

5. The tuner device as set forth in claim 4, wherein the value A1 is set in a range of (B–0.5) to (B–1.0) [V], and the value A2 is set in a range of (B+0.5) to (B+1.0) [V].

6. A phase-locked loop (PLL) tuning control method comprising the steps of:
   monitoring a voltage value of an automatic frequency control (AFC) signal;
   detecting a first frequency at which a first threshold voltage value accords with the AFC voltage value while varying an oscillation frequency of a local oscillator in either direction of frequency-increasing or frequency-decreasing in accordance with an AFC value when a synchronous signal of a broadcasting to be received is first detected;
   detecting a second frequency at which a second threshold voltage value having a value different from the first threshold value accords with the AFC voltage value while varying the oscillation frequency in a reversed direction for which the first frequency has been detected; and
   locking the second frequency as a center frequency of the broadcasting to be received.

7. The PLL tuning control method as set forth in claim 6, wherein the first threshold voltage value is set as two voltage values defining a predetermined voltage width, and the second threshold voltage value is set as a predetermined single voltage value.

8. The PLL tuning control method as set forth in claim 7, wherein the predetermined voltage width is set so as to cover an irregular variation width of the AFC voltage value.

9. The PLL tuning control method as set forth in claim 7, wherein when the lower value of the first threshold voltage value is set as A1, the higher value of the first threshold voltage value is set as A2, and the second threshold voltage value is set as B, in the first frequency detecting step, the oscillation frequency is lowered until the AFC voltage value exceeds the value A2 if the AFC voltage values is less than the value B when the synchronous signal is first detected, and is raised until the AFC voltage value becomes less than the value A1 if the AFC voltage value exceeds the value B when the synchronous signal is first detected.

10. The PLL tuning control method as set forth in claim 9, wherein the value A1 is set in a range of (B−0.5) to (B−1.0) [V], and the value A2 is set in a range of (B+0.5) to (B+1.0) [V].

* * * * *